(12) United States Patent
Tsuno

(10) Patent No.: US 8,963,513 B2
(45) Date of Patent: Feb. 24, 2015

(54) SWITCHING POWER SOURCE

(75) Inventor: Takashi Tsuno, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 340 days.

(21) Appl. No.: 13/306,295

(22) Filed: Nov. 29, 2011

(65) Prior Publication Data

US 2012/0133351 A1 May 31, 2012

Related U.S. Application Data

(60) Provisional application No. 61/418,185, filed on Nov. 30, 2010.

(30) Foreign Application Priority Data

Nov. 30, 2010 (JP) ................................. 2010-265959

(51) Int. Cl.
*G05F 3/18* (2006.01)
*H02M 1/08* (2006.01)
*H02M 3/158* (2006.01)
*H02M 7/5387* (2007.01)
*H03K 17/66* (2006.01)

(52) U.S. Cl.
CPC .............. *H02M 1/08* (2013.01); *H02M 3/1588* (2013.01); *H02M 7/5387* (2013.01); *H03K 17/663* (2013.01); *H03K 2217/0045* (2013.01); *Y02B 70/1466* (2013.01)
USPC .......................................... 323/225; 327/430

(58) Field of Classification Search
CPC .............. G05F 3/18; G05F 3/22; G05F 1/56; H02M 3/158; H02M 3/1582; H02M 3/1584
USPC ......... 323/219, 223, 265, 311, 349, 327, 225; 327/101, 103, 177, 423, 424, 430–432, 327/508, 538, 542, 108–112
See application file for complete search history.

(56) References Cited

U.S. PATENT DOCUMENTS 6,636,024 B2 * 10/2003 Zametzky .................... 323/282
7,719,055 B1 * 5/2010 McNutt et al. ............... 257/341

(Continued)

FOREIGN PATENT DOCUMENTS

| JP | 2000-083369 A | 3/2000 |
| JP | 2004-356931 A | 12/2004 |
| JP | 2006-223016 A | 8/2006 |

OTHER PUBLICATIONS

Tamotsu Inaba, "Basics and Actuality of Power MOS FET Utilization," CQ Publishing Co., Ltd., Feb. 1, 2010, p. 136.
Notice of Reasons for Rejection in Japanese Patent Application No. 2010-265959, dated Jun. 3, 2014.

*Primary Examiner* — Adolf Berhane
*Assistant Examiner* — Yemane Mehari
(74) *Attorney, Agent, or Firm* — Venable LLP; Michael A. Sartori; F. Brock Riggs

(57) ABSTRACT

A switching power source according to one embodiment includes a first transistor and a second transistor. The first transistor is connected to a positive electrode of a DC voltage source. The second transistor is connected between the first transistor and a negative electrode of the DC voltage source. The first transistor and the second transistor are alternately placed in conducting state. A gate signal is applied to a gate terminal of the first transistor with reference to a voltage of a terminal of the first transistor that is connected to the positive electrode. A gate signal is applied to a gate terminal of the second transistor with reference to a voltage of a terminal of the second transistor that is connected to the negative electrode. The first transistor and the second transistor are configured with wide bandgap semiconductors of mutually different materials, respectively.

3 Claims, 2 Drawing Sheets

(56) References Cited

U.S. PATENT DOCUMENTS

| | | | |
|---|---|---|---|
| 7,960,929 B2* | 6/2011 | Niikura | 318/400.17 |
| 8,130,023 B2* | 3/2012 | Veliadis | 327/430 |
| 2009/0009232 A1* | 1/2009 | Helfrich et al. | 327/430 |

* cited by examiner

SWITCHING POWER SOURCE

RELATED APPLICATIONS

This application claims priority to Provisional Application Ser. No. 61/418,185 filed on Nov. 30, 2010 and claims the benefit of Japanese Patent Application No. 2010-265959, filed Nov. 30, 2010, all of which are incorporated herein by reference in their entirety.

BACKGROUND

1. Field

Embodiments of the present invention relate to a switching power source.

2. Related Background Art

In some switching power sources, a first N channel MOS transistor and a second N channel MOS transistor are provided between a positive electrode and a negative electrode of a DC voltage source. In such a switching power source, the first N channel transistor and the second N channel transistor are alternately placed in conducting state by controlling gate voltages that are applied to the first N channel transistor and the second N channel transistor, respectively.

In such a switching power source, the gate voltage is applied to the gate terminal of the second N channel transistor with reference to the voltage of the terminal that is connected to the negative electrode. The gate voltage is applied to the gate terminal of the first N channel transistor with reference to the voltage at a midpoint between the first N channel transistor and the second N channel transistor.

However, the midpoint is connected to neither the positive electrode nor the negative electrode of the DC voltage source. Therefore, the voltage at the midpoint fluctuates. In conventional switching power sources, accordingly, the gate voltage is applied to the gate terminal through a photocoupler or a transformer, for instance as disclosed in Tamotsu Inaba, "Pawa MOS FET katsuyo no kiso to jissai (Fundamentals and practice of power MOS-FET use)", 6th edition, CQ Publishing. Co., Ltd., Feb. 1, 2010, page 136.

SUMMARY

The above-described conventional switching power source may exhibit limitations in high-speed driving. For instance, high-speed driving of the switching power source may be limited on account of photocoupler delay.

In the present technical field, therefore, a switching power source is required that is capable of high-speed driving.

A switching power source according to one aspect of the present invention includes a first transistor and a second transistor. The first transistor is connected to a positive electrode of a DC voltage source. The second transistor is connected between the first transistor and a negative electrode of a DC voltage source. The first transistor and the second transistor are alternately placed in conducting state. A gate signal is applied to a gate terminal of the first transistor with reference to a voltage of a terminal of the first transistor that is connected to the positive electrode. A gate signal is applied to a gate terminal of the second transistor with reference to a voltage of a terminal of the second transistor that is connected to the negative electrode. The first transistor and the second transistor are configured with wide bandgap semiconductors of mutually different materials, respectively.

In the switching power source, a gate voltage is applied to a gate terminal of the first transistor that is connected to the positive electrode of the DC voltage source, with reference to the voltage of a terminal connected to the positive electrode. Therefore, a stable reference gate voltage can be applied to the first transistor without a photocoupler or transformer. Accordingly, the switching power source is capable of high-speed operation. In addition, using in the second transistor a wide bandgap semiconductor different from commonly used semiconductors allows realizing a first transistor that can be driven with reference to the voltage of the terminal connected to the positive electrode in a switching power source where high-speed operation is required.

In one embodiment, the first transistor may be a P channel MOS transistor, and the second transistor may be an N channel MOS transistor. In one embodiment, the wide bandgap semiconductor that configures the first transistor may comprise diamond. The structure of the transistors is not limited to that of a MOS transistor (MOSFET), and may be that of a junction type transistor (JFET). The transistors are not limited to being vertical type or horizontal type transistors.

As described above, a switching power source that is capable of high-speed driving is provided.

DETAILED DESCRIPTION

Figure 1:
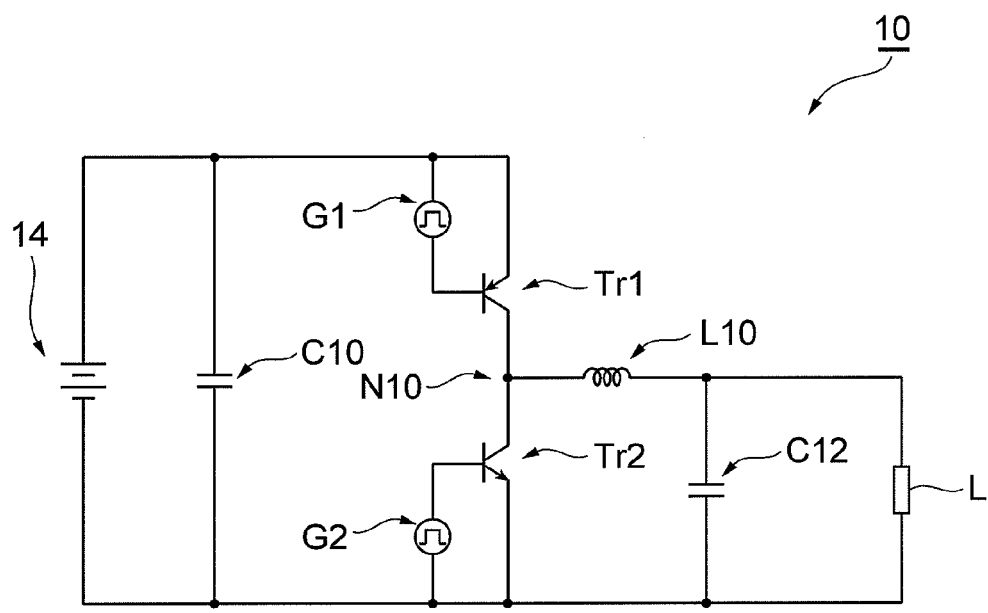
FIG. 1 is a circuit diagram of a switching power source according to one embodiment.

Various embodiments of the present invention are explained in detail with reference to accompanying drawings. In the drawings, identical or equivalent portions are denoted with the same reference symbol.

FIG. 1 is a circuit diagram of a switching power source according to one embodiment. A switching power source 10 illustrated in FIG. 1 includes a first transistor Tr1 and a second transistor Tr2. In one embodiment, the switching power source 10 may further includes a capacitor C10, an inductor L10 and a capacitor C12.

The transistor Tr1 is connected to a positive electrode of a DC voltage source 14. The transistor Tr2 is connected between the transistor Tr1 and a negative electrode of the DC voltage source 14. The capacitor C10 is connected in parallel to the DC voltage source 14, as illustrated in FIG. 1. One end of the inductor L10 is connected to a midpoint N10 between the transistor Tr1 and the transistor Tr2. One end of the capacitor C12 is connected to the other end of the inductor L10. The other end of the capacitor C12 is connected to the negative electrode of the DC voltage source 14. To the switching power source 10, a load L is connected in parallel to the capacitor C12.

The configuration of the switching power source 10 is explained in more detail below. As illustrated in FIG. 1, a first terminal of the transistor Tr2 is connected to the midpoint N10, and a second terminal of the transistor Tr2 is connected to the negative electrode of the DC voltage source 14. The transistor Tr2 is controlled by a gate signal from a gate signal generator G2. The gate signal generator G2 applies, to the transistor Tr2, a gate signal with reference to the voltage of the second terminal connected to the negative electrode of the DC voltage source 14.

In one embodiment, the transistor Tr2 may be an N channel junction type transistor or MOS transistor. In this case, the first terminal of the transistor Tr2 is a drain terminal, and the second terminal is a source terminal. More specifically, the transistor Tr2 may be a vertical type or horizontal type N channel junction type transistor or MOS transistor. The wide bandgap semiconductor that configures an N channel transistor includes, for example, SiC or GaN.

The first terminal of the transistor Tr1 is connected to the positive electrode of the DC voltage source 14, and the second terminal of the transistor Tr1 is connected to the midpoint N10. The transistor Tr1 is controlled by a gate signal from a gate signal generator G1. The gate signal generator G1 applies, to the transistor Tr1, a gate signal with reference to the voltage of the first terminal connected to the positive electrode of the DC voltage source 14.

In the switching power source 10, the transistor Tr1 is made up of a wide bandgap semiconductor that is different from that of the transistor Tr2. In one embodiment, the transistor Tr1 may be a P channel junction type transistor or MOS transistor. In this case, the first terminal of the transistor Tr1 is a drain terminal, and the second terminal is a source terminal. The wide bandgap semiconductor that configures a P channel transistor includes diamond and cBN (cubic boron nitride). The transistors may each be of vertical type or horizontal type.

In the switching power source 10, the transistor Tr1 and the transistor Tr2 are alternately placed in conducting state based on respective gate signals from the gate signal generator G1 and the gate signal generator G2. As a result, substantially DC voltage is generated in the capacitor C12, and DC power is applied to the load L.

In the switching power source 10 having such a configuration, a gate voltage based on the voltage of the terminal connected to the positive electrode is applied to the gate terminal of the first transistor Tr1 that is connected to the positive electrode of the DC voltage source 14. Therefore, a stable reference gate voltage can be applied to the first transistor Tr1 without a photocoupler or transformer. Accordingly, the switching power source 10 is capable of high-speed operation.

In addition, utilizing a wide bandgap semiconductor that is different from a semiconductor material commonly used in the second transistor Tr2, a first transistor can be realized that can be driven with reference to the voltage coupled to the positive electrode. More specifically, a conventional P channel MOS transistor or junction type transistor made up of Si semiconductor is not appropriate for switching power sources where high-speed operation is required, due to its characteristic of a small rated drain current, i.e. the characteristic of a small ampacity. In contrast, using a wide bandgap semiconductor, such as diamond or cBN, that is different from that of the second transistor Tr2, allows realizing a first transistor Tr1 that can be driven with reference to the voltage of the terminal connected to the positive electrode in the switching power source 10 where high-speed operation is required.

Figure 2:
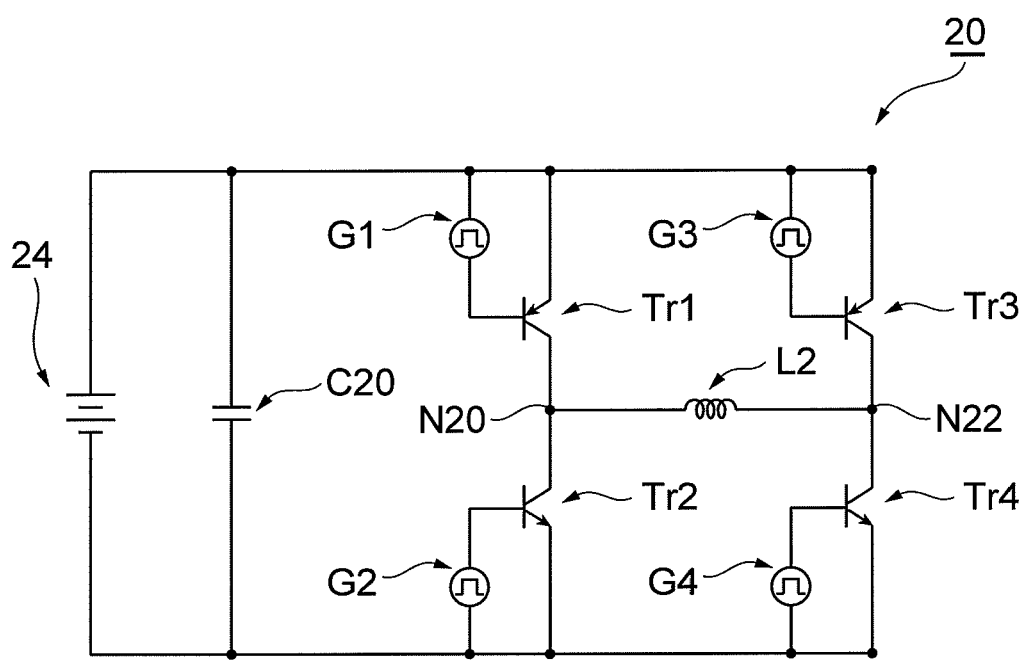
FIG. 2 is a circuit diagram of a switching power source according to another embodiment.

A switching power source according to another embodiment is explained next. FIG. 2 is a circuit diagram of a switching power source according to another embodiment. A switching power source 20 illustrated in FIG. 2 further includes a third transistor Tr3 and a fourth transistor Tr4, in addition to the first transistor Tr1 and the second transistor Tr2.

The switching power source 20 may include a capacitor C20 that is similar to the capacitor C10 of the switching power source 10. The capacitor C20 is connected in parallel to the DC voltage source 24.

The transistor Tr1 is connected to a positive electrode of a DC voltage source 24. The transistor Tr2 is connected between the transistor Tr1 and a negative electrode of the DC voltage source 24. The transistor Tr2 is configured with a wide gap semiconductor different from the semiconductor that configures the transistor Tr1. In one embodiment, the transistor Tr1 may be a horizontal type P channel junction type transistor, and the transistor Tr2 may be a horizontal type N channel junction type transistor. The N channel junction type transistor can be configured with a semiconductor material such as SiC or GaN. The horizontal type P channel junction type transistor can be configured with a semiconductor material such as diamond or cBN.

The gate signal source G1 applies a gate signal to the transistor Tr1 with reference to the voltage of the terminal of the transistor Tr1 that is connected to the positive electrode of the DC voltage source 24. The gate signal source G2 applies a gate signal to the transistor Tr2 with reference to the voltage of the terminal of the transistor Tr2 that is connected to the negative electrode of the DC voltage source 24.

The transistor Tr3 is provided in parallel to the transistor Tr1, and is connected to a positive electrode of a DC voltage source 24. The transistor Tr4 is provided in parallel to the transistor Tr2, and is connected between the transistor Tr3 and a negative electrode of the DC voltage source 24.

The transistor Tr3 is configured with a wide gap semiconductor different from the semiconductor that configures the transistor Tr4. In one embodiment, the transistor Tr3 may be a vertical type P channel MOS transistor, and the transistor Tr4 may be a vertical type or horizontal type N channel junction type transistor or MOS transistor. The N channel transistor can be configured with a semiconductor material such as SiC or GaN. The P channel MOS transistor can be configured with a semiconductor material such as diamond or cBN.

More specifically, the first terminal (for instance, drain terminal) of the transistor Tr3 is connected to the positive electrode of the DC voltage source 24. The second terminal (for instance, source terminal) of the transistor Tr3 is connected to a midpoint N22 between the transistor Tr3 and the transistor Tr4. A gate signal from a gate signal generator G3 is applied to the gate terminal of the transistor Tr3 with reference to the voltage of the first terminal of the transistor Tr3 that is connected to the positive electrode of the DC voltage source 24.

A first terminal (for instance, drain terminal) of the transistor Tr4 is connected to the midpoint N22, and a second terminal (for instance, source terminal) of the transistor Tr4 is connected to the negative electrode of the DC voltage source 24. A gate signal from a gate signal generator G4 is applied to the gate terminal of the transistor Tr4 with reference to the voltage of the second terminal of the transistor Tr4 that is connected to the negative electrode of the DC voltage source 24.

A load L2 (in the present example, an inductor) is connected between the midpoint N22 and a midpoint N20 between the transistor Tr1 and the transistor Tr2 of the switching power source 20. In the switching power source 20, gate signals from the gate signal generators G1 to G4 are applied such that the transistor Tr2 and the transistor Tr3 are placed in non-conducting state at a period where the transistor Tr1 and the transistor Tr4 are placed in conducting state. Conversely, gate signals from the gate signal generators G1 to G4 are applied such that the transistor Tr1 and the transistor Tr4 are placed in non-conducting state at a period where the transistor Tr2 and the transistor Tr3 are placed in conducting state. As a result, AC voltage is applied to the load L2.

In the switching power source 20 as well, gate signals are applied to the transistor Tr1 and the transistor Tr3 that are connected to the positive electrode of the DC voltage source 24 with reference to the voltages of the terminals that are connected to the positive electrode. Therefore, stable reference gate voltages can be applied to the transistor Tr1 and the transistor Tr3 without a photocoupler or transformer. Accordingly, the switching power source 20 is capable of high-speed operation.

In addition, using a wide bandgap semiconductor, such as diamond or cBN, that is different from that of the transistor Tr2 and the transistor Tr4, allows realizing a transistor Tr1 and a transistor Tr3 that can be driven with reference to the voltages of the terminals connected to the positive electrode in the switching power source 20 where high-speed operation is required.

What is claimed is:

1. A switching power source, comprising:
    a first transistor having a first terminal, a second terminal, and a gate terminal, the first terminal of the first transistor being connected to a positive electrode of a DC voltage source;
    a second transistor having a first terminal, a second terminal, and a gate terminal, the first terminal of the second transistor being connected to the second terminal of the first transistor and the second terminal of the second transistor being connected to a negative electrode of the DC voltage source;
    a first gate signal generator connected between the first terminal of the first transistor and the gate terminal of the first transistor; and
    a second gate signal generator connected between the second terminal of the second transistor and the gate terminal of the second transistor, the first transistor and the second transistor being alternately placed in conducting state with the first and second gate signal generators,
    wherein a gate signal is applied from the first gate signal generator to the gate terminal of the first transistor with reference to a voltage of the first terminal of the first transistor,
    a gate signal is applied from the second gate signal generator to the gate terminal of the second transistor with reference to a voltage of the second terminal of the second transistor, and
    the first transistor and the second transistor are configured with wide bandgap semiconductors of mutually different materials, respectively, the first transistor is configured with diamond or cubic boron nitride, and the second transistor is configured with SiC or GaN.

2. The switching power source according to claim 1,
    wherein the first transistor is a P channel junction type transistor, and
    the second transistor is an N channel junction type transistor.

3. The switching power source according to claim 1, wherein the wide bandgap semiconductor that configures the first transistor comprises diamond.

* * * * *